(12) United States Patent
Findley et al.

(10) Patent No.: US 7,206,369 B2
(45) Date of Patent: Apr. 17, 2007

(54) PROGRAMMABLE FEEDBACK DELAY PHASE-LOCKED LOOP FOR HIGH-SPEED INPUT/OUTPUT TIMING BUDGET MANAGEMENT AND METHOD OF OPERATION THEREOF

(75) Inventors: Randall L. Findley, Austin, TX (US); Sajol C. Ghoshal, Austin, TX (US); Gregory E. Beers, Austin, TX (US)

(73) Assignee: Agere Systems Inc., Allentown, PA (US)

( * ) Notice: Subject to any disclaimer, the term of this patent is extended or adjusted under 35 U.S.C. 154(b) by 755 days.

(21) Appl. No.: 09/977,045

(22) Filed: Oct. 12, 2001

(65) Prior Publication Data
US 2003/0072400 A1  Apr. 17, 2003

(51) Int. Cl.
*H03D 3/24* (2006.01)
(52) U.S. Cl. .................. 375/373; 327/149; 327/158

(58) Field of Classification Search .............. 375/294, 375/327, 354, 355, 356, 357, 371, 373, 376; 327/141, 155, 156, 159, 161
See application file for complete search history.

(56) References Cited

U.S. PATENT DOCUMENTS

| | | | | | |
|---|---|---|---|---|---|
| 5,815,016 | A | * | 9/1998 | Erickson | 327/158 |
| 5,859,550 | A | * | 1/1999 | Brandt | 327/156 |
| 5,966,388 | A | * | 10/1999 | Wright et al. | 714/719 |
| 6,025,745 | A | * | 2/2000 | Lee et al. | 327/277 |
| 6,028,462 | A | * | 2/2000 | Kyles | 327/277 |
| 6,075,398 | A | * | 6/2000 | Furman | 327/291 |
| 6,268,753 | B1 | * | 7/2001 | Sandusky | 327/266 |
| 6,377,101 | B1 | * | 4/2002 | Eto et al. | 327/270 |
| 6,587,811 | B2 | * | 7/2003 | Schleifer et al. | 702/176 |
| 2001/0036160 | A1 | * | 11/2001 | Curran et al. | 370/290 |

* cited by examiner

*Primary Examiner*—Kevin Kim

(57) ABSTRACT

A phase-locked loop (PLL), a method of programmably adjusting a phase of a reference clock signal and a synchronous sequential logic circuit incorporating the PLL or the method. In one embodiment, the PLL includes: (1) a digital feedback delay line having a plurality of taps and (2) tap selection logic, coupled to the digital feedback delay line, for activating one of the plurality of taps and thereby insert a corresponding delay into the PLL.

20 Claims, 4 Drawing Sheets

PROGRAMMABLE FEEDBACK DELAY PHASE-LOCKED LOOP FOR HIGH-SPEED INPUT/OUTPUT TIMING BUDGET MANAGEMENT AND METHOD OF OPERATION THEREOF

TECHNICAL FIELD OF THE INVENTION

The present invention is directed, in general, to a and, more specifically, to a programmable phase-locked loop (PLL) feedback delay for high-speed input/output (I/O) timing budget management and method of operating the same.

BACKGROUND OF THE INVENTION

Modern digital electronic computers include a number of cooperating sequential logic circuits that each perform several routine operations, and are each controlled by derivatives of a common clock signal. The clock signals should be synchronized at predetermined locations within the system to help optimize computer function. Although the individual clock signals may have a common source, they often do not arrive at their intended destinations in proper synchronism, for example due to variations in signal propagation delay for each destination. Thus, combining several complex sequential logic circuits within a system presents a challenge with respect to synchronizing the time frames between the respective circuits therein.

Because synchronous sequential logic circuits change states at the rising or falling edge of a synchronous clock signal, proper circuit operation often demands that any external input signals to the synchronous sequential logic circuit generate valid inputs that occur with the proper set up time and hold time requirements relative to the designated clock edge. However, in a system including sequential logic circuits having a master system (or board) clock that operates the several diverse system chip circuits, there is often a problem with skew (different amounts of delay in different portions of the device) between the system clock and the destination clock signals propagating through the various circuits.

As higher density programmable logic devices (PLDs) become available, on-chip clock distribution becomes more important to the integrity and performance of the designs implemented in these devices. Unfortunately, with the advent of high-density PLDs, such as a field programmable gate array (FPGA), difficulties in managing clock delay and clock skew associated with these devices has become substantial. Many existing solutions for these problems, such as hardwired clock trees, are less effective for the high density PLDs found in today's programmable logic market. As integration levels of microelectronic circuits and system complexity continues to increase, the routing or distribution of a master system (or board) clock has become even more critical. The problem is also exacerbated as clock rates increase.

A common solution to these problems is the incorporation of a clock and data recovery system (CDR), also known as a programmable clock manager (PCM), into the PLDs themselves. A PCM may be used to adjust the clock phase and clock duty cycle for system clocks found in most chips. In general, a PCM compares an incoming master clock signal and a feedback data signal in order to generate an output clock signal based on a comparison of phase and/or frequency of the two input signals. Conventional PCMs may be found in either phase-locked loop (PLL) or delay-locked loop (DLL) architecture to assist in synchronizing clock signals in the PLD. Although DLL circuitry may be used to resolve some of the problems in today's PLDs, employing a voltage controlled oscillator (VCO) to create a PLL architecture has continued to gain popularity among device designers.

A VCO generally adjusts the various signals, such that the edges of the internal clock signals are aligned with those of a master clock signal, even though the time frame of each signal is thereby shifted. The PLL architecture provides feedback that is used to nullify clock distribution delays within the chip by comparing the phase of a master clock signal with that of a feedback signal. The difference between the two signals is used in a feedback control system to bring the first and second signals into a fixed phase relation. Logical elements, such as an AND gate and a divider, logically combine the master clock signal with the feedback signal to provide a synchronization signal for the chip circuits. More specifically, the master clock signal is compared with the feedback signal and a reference (synchronization) signal is generated in response to the difference. Delay circuitry may be used to produce delays in the output clock signal based on a selected delay time, depending on the application of the output clock signal. Alternatively, delay compensation may be used to synchronize the master clock and feedback signals based on the reference signal. In this way, all circuits within the chip receive synchronous clock signals and clock signal skew is reduced.

One of the more popular PLL designs used in the chips found in today's PLDs is the inclusion of a PLL to remove the insertion delay of their internal clock trees. Such designs allow better clock-to-out values on the outputs of the PCM, as well as improved setup and hold requirements on the inputs. However, this popular design is not well-suited for use in high frequency applications, such as those requiring clock speeds in excess of 125 MHZ. Specifically, in such designs, delays inside the chip containing the PCM that are not reduced or eliminated by the PLL circuit of the PCM still hamper high frequency uses since such delays are typically exacerbated when applied to high frequency applications. Another popular design includes the use of clock forwarding, which requires all the separate chips to source a clock along with the data. While beneficial in numerous applications, this design is not well-suited for use in SSRAM and SDRAM applications since those applications require the clock to be single-sourced externally.

Accordingly, what is needed in the art is a better way to compensate for timing variations encountered when a single-sourced board clock is used in high frequency applications.

SUMMARY OF THE INVENTION

To address the above-discussed deficiencies of the prior art, the present invention provides a PLL, a method of programmably adjusting a phase of a reference clock signal and a synchronous sequential logic circuit incorporating the PLL or the method. In one embodiment, the PLL includes: (1) a digital feedback delay line having a plurality of taps and (2) tap selection logic, coupled to the digital feedback delay line, for activating one of the plurality of taps and thereby insert a corresponding delay into the PLL.

The present invention therefore introduces the broad concept of interjecting a multitap digital delay line into a PLL and associated logic that allows one of the taps (representing a desired delay) to be selected. A single PLL can thereby be adapted to yield a given delay, depending upon its programming.

In one embodiment of the present invention, each of the taps comprises a multiplexer. In a more specific embodiment, the multiplexer is a 2:1 input multiplexer.

In one embodiment of the present invention, the digital feedback delay line has at least four of the taps. In a more specific embodiment, the digital feedback delay line has 32 of the taps.

In one embodiment of the present invention, the PLL drives a latch. Those skilled in the pertinent art will understand, however, that the PLL of the present invention may be used in many different applications that call for varying amounts of clock delay to achieve synchronous operation of interconnected components.

In one embodiment of the present invention, the tap selection logic comprises a register. Other selection logic is, of course, within the broad scope of the present invention.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
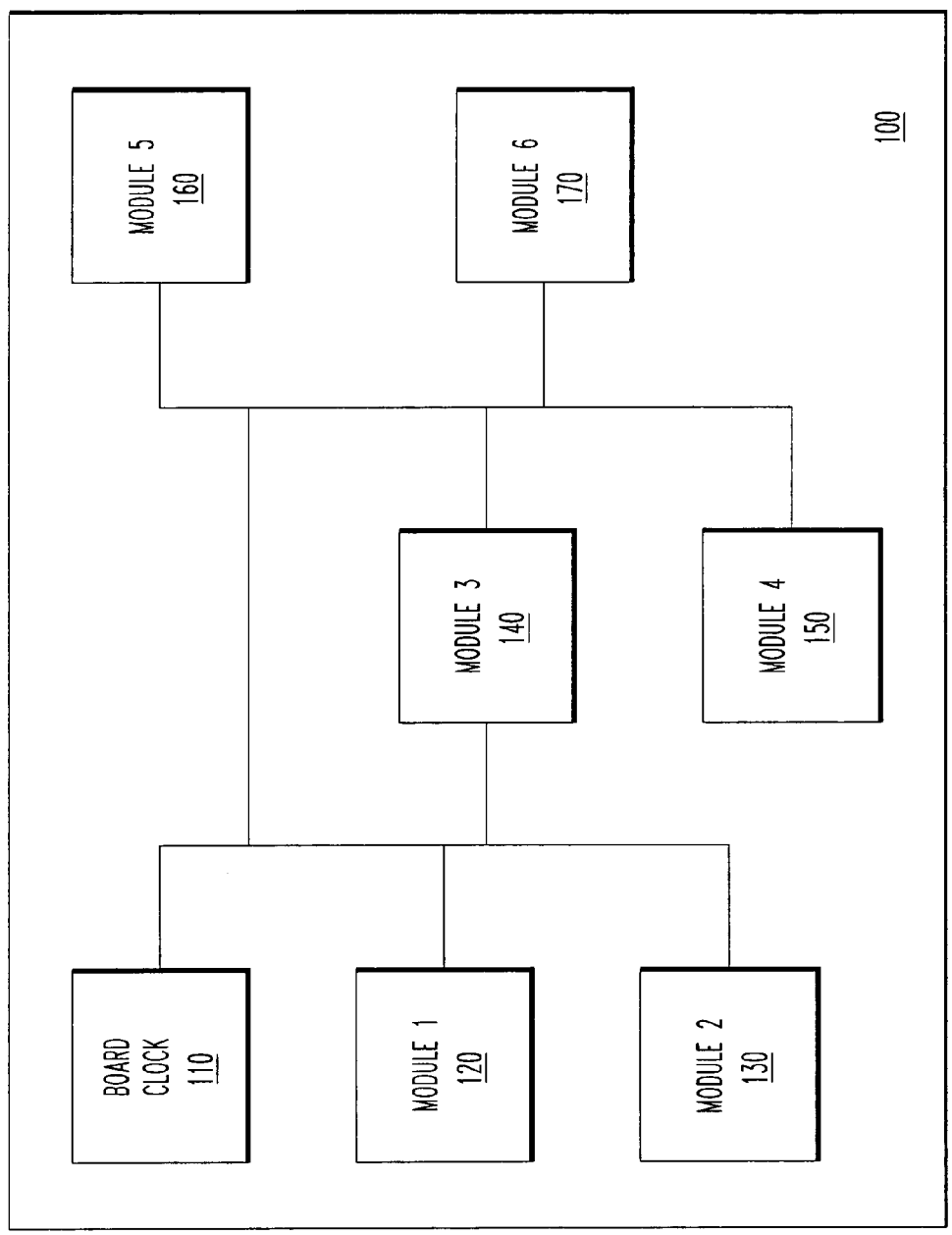
FIG. 1 illustrates a block diagram of a synchronous sequential logic circuit employing a single-sourced board clock and a PLL constructed, or a method carried out, according to the principles of the present invention.

Referring initially to FIG. 1, illustrated is a block diagram of a synchronous sequential logic circuit, generally designated 100. The circuit 100 includes a single-sourced board clock 110 that provides a reference clock signal. The circuit 100 also includes a plurality of interconnected modules 120, 130, 140, 150, 160, 170 that are interconnected to each other and, by virtue of their further connection to the board clock 110, operate synchronously to communicate data among the plurality of interconnected modules 120, 130, 140, 150, 160, 170.

As described above, propagation delays are inherent in providing the reference clock signal over the circuit 100 as a whole. At lower clock frequencies, these propagation delays may be disregarded. At higher frequencies, however, these propagation delays become crippling, and can result in a loss of synchronization and data.

Accordingly, each of the plurality of interconnected modules 120, 130, 140, 150, 160, 170 is provided with a PLL (neither shown nor referenced in FIG. 1). Each PLL is designed to provide a phase adjustment to the reference clock signal to compensate for any propagation delay. Of course, each PLL could be custom-designed to provide a custom phase adjustment for each of the plurality of interconnected modules 120, 130, 140, 150, 160, 170. However, it is more advantageous to provide a single PLL design that is capable of being programmed to provide a custom phase adjustment for each of the plurality of interconnected modules 120, 130, 140, 150, 160, 170. It is yet more advantageous to provide an easy way to program the custom phase adjustment into each of the PLLs. In the embodiment to be illustrated in FIG. 3, a register is employed to program the custom phase adjustment.

Figure 2:
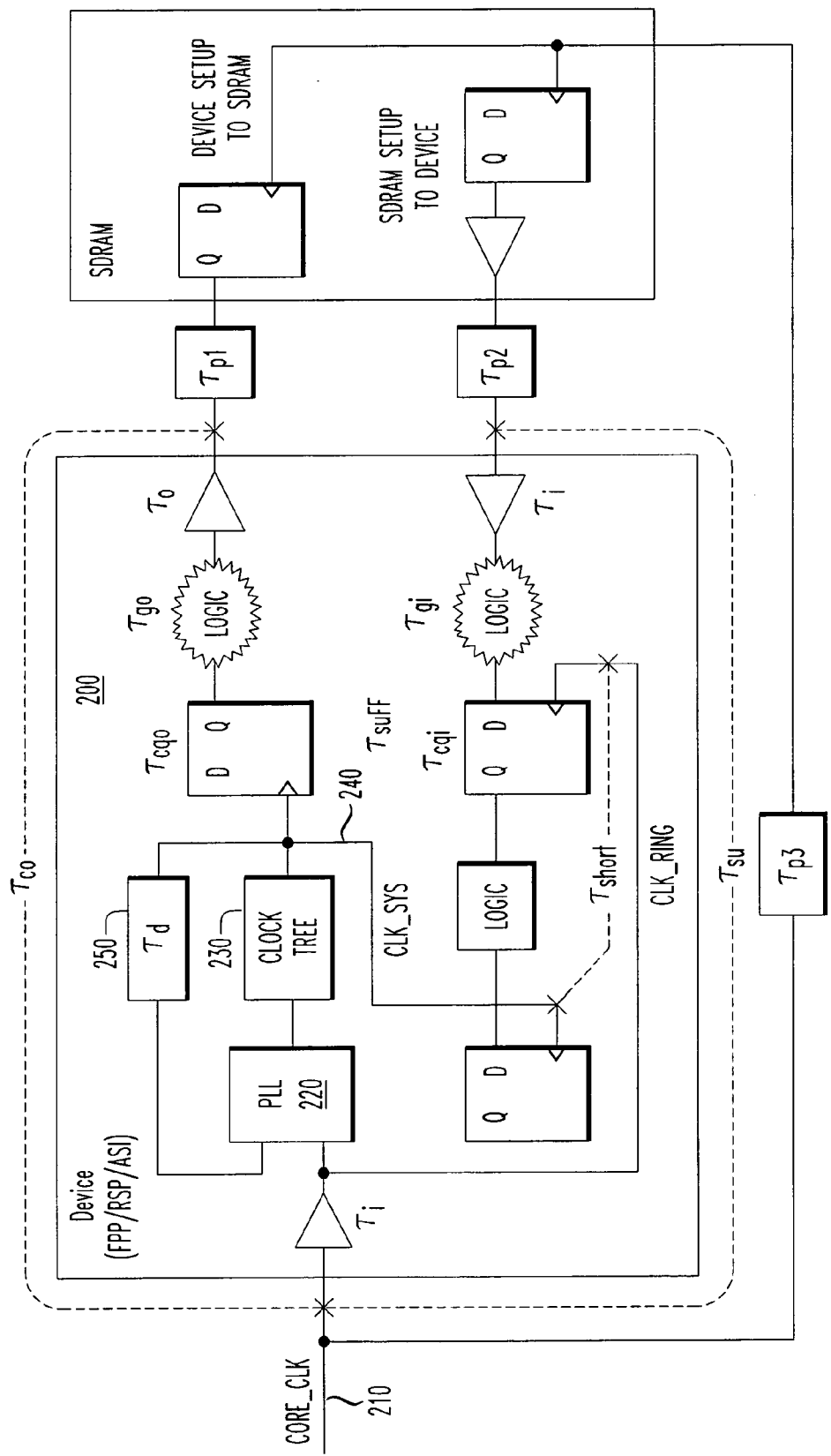
FIG. 2 illustrates an embodiment of a PLL constructed according to the principles of the present invention.

Turning now to FIG. 2, illustrated is a block diagram of a PLL circuit, generally designated 200, constructed according to the principles of the present invention. A core_clk signal 210 is the reference clock signal discussed above. The core_clk signal 210 is provided to a PLL charge pump 220 that generates a current in response to the core_clk signal 210. A clock tree 230 receives and processes the current to produce a clk_sys signal 240, which is employed locally as a time base from which to synchronize an associated module (in this case, a synchronous dynamic random access memory, or SDRAM).

Of particular interest to the present invention is a feedback portion of the PLL circuit. The feedback portion is designated $\tau_d$ and takes the form of a digital feedback delay line 250, which is responsible for feeding back to the PLL charge pump 220 a time-delayed portion of the clk_sys signal 240. This time-delayed portion is employed to adjust the phase of the clk_sys signal 240 relative to the core_clk signal 210.

The main concern with respect to the PLL circuit 200 of FIG. 2 is $\tau_{co}$, which is the largest component of budget calculations. In one particular application employing seven modules, $\tau_{co}$ varies from 3.23 to 5.40 nanoseconds. Since other components associated with each module (namely, an output latch, a Joint Test Action Group multiplexer and an output buffer) introduce a delay (e.g., 4.5 nanoseconds) that is larger than some values of $\tau_{co}$, some of these components should be driven with a clock having an earlier phase than the core_clk signal 210. The phase difference, with reference to the PLL circuit 200 input, is the difference between the total pad delay ($\tau_o$) and the desired clock-to-out ($\tau_{co}$), plus any internal gate delay before reaching the pad ($\tau_{go}$) The formula for this phase difference is:

$$\Phi_{clk\_sys} = \Phi_{core\_clk} - [(\tau_o - \tau_{co}) + \tau_{cgo} + \tau_{go}]$$

The second concern is setup time ($\tau_{su}$) for the application-specific integrated circuit (ASIC) as a whole, which for most of the interfaces that use the board clock is 1.50 nanoseconds (in the illustrated embodiment). This means that the phase of the clock to the input flip-flop ($\Phi_{clk\_ring}$) must be less than 1.50 nanoseconds from the external clock, plus any input delay and flip-flop setup time. The formula for this phase difference should take into account the difference in the insertion delay for the input lock (clk_ring) and the data input. The formula for the setup time constraint, ignoring clock skew and jitter is:

$$\Phi_{clk\_ring} - [\Phi_{core\_clk} + \tau_i + \tau_{gi} + \tau_{suFF}] < \tau_{su}$$

For the worst-case loaded SSRAM port or SDRAM DIMM port, the setup time should be less than 1.05 nanoseconds; otherwise, it is 1.50 nanoseconds. Thus, the input clock (clock_ring) should be tightly coupled to the board clock (core_clock). The clock tree 230 provides this function, ensuring that the internal clock (clk_sys) phase is $\tau_i - \tau_d$ earlier than the board clock (core_clk).

Figure 3:
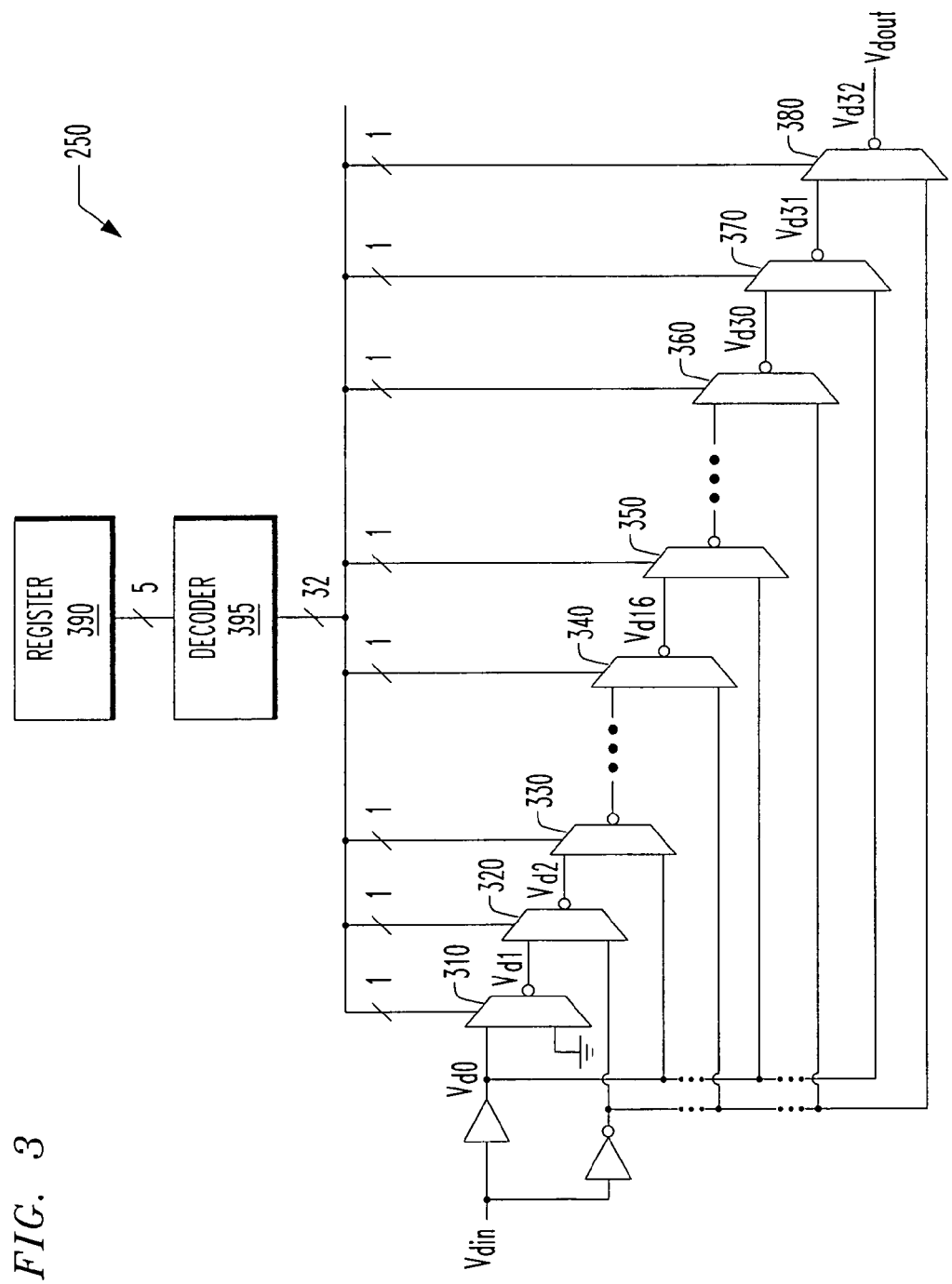
FIG. 3 illustrates a more detailed view of a digital feedback delay line and tap selection logic contained in the PLL of FIG. 2.

Turning now to FIG. 3, illustrated is a more detailed view of the digital feedback delay line 250 and tap selection logic contained in the PLL of FIG. 2. The digital feedback delay line 250 is illustrated as including a plurality of taps 310, 320, 330, 340, 350, 360, 370, 380. In the illustrated embodiment, the digital feedback delay line 250 has 32 taps (only eight are actually shown, but ellipses between the $3^{rd}$ tap 330 and the $15^{th}$ tap 340, and the $16^{th}$ tap 350 and the $30^{th}$ tap 360 are intended to represent the remaining taps).

Each of the plurality of taps 310, 320, 330, 340, 350, 360, 370, 380 is embodied in a 2:1 input multiplexer. The input multiplexers are cascaded, such that a signal appearing at an input of the $1^{st}$ tap 310 is gated through to the input of the $2^{nd}$ tap 320, and so on, until the signal is eventually gated out of the $32^{nd}$ tap 380.

Tap selection logic in the illustrated embodiment includes a register 390 and a decoder 395. The register 390 is illustrated as being five bits wide, and therefore capable of holding 32 unique binary numbers. The decoder 395 receives the number programmed into the register 390, decodes it into a selection bit, and delivers the selection bit on one of 32 lines coupling the decoder 395 to respective ones of the plurality of taps 310, 320, 330, 340, 350, 360, 370, 380 (and those not shown).

By way of illustration, if the register 390 contains a value of 16 (10000 binary), the decoder 395 decodes the number into a selection bit on the line that couples the decoder 395 to the $16^{th}$ tap 350.

If the $1^{st}$ tap 310 is selected, the input signal $VD_{in}$ is delayed by virtue of having to traverse all 32 taps (yielding a maximum delay). If the $32^{nd}$ tap 380 is selected, the input signal $VD_{in}$ is delayed by virtue of having to traverse only the $32_{nd}$ tap 380 (yielding a minimum delay).

The delay introduced by the digital feedback delay line 250 is inversely proportional to the phase adjustment performed on the core_clk signal 210; as greater delays are programmed into the digital feedback delay line 250, the phase of the core_clk signal 210 is so advanced.

Figure 4:
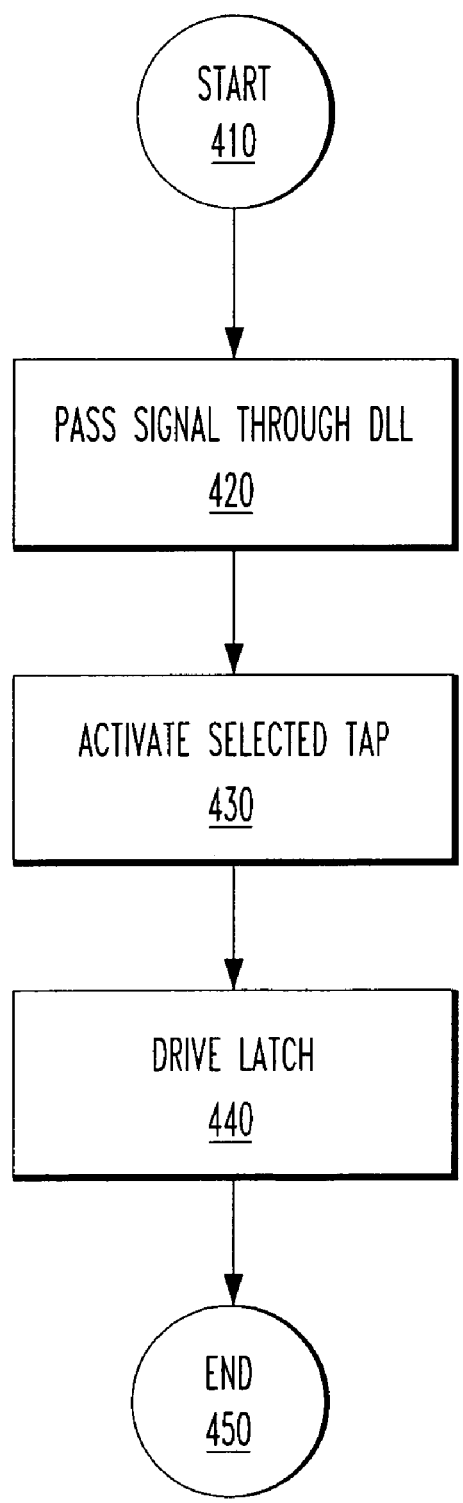
FIG. 4 illustrates a method of programmably adjusting a phase of a reference clock signal carried out according to the principles of the present invention.

Turning now to FIG. 4, illustrated is a method, generally designated 400, of programmably adjusting a phase of a reference clock signal carried out according to the principles of the present invention. The method 400 begins in a start step 410, wherein it is desired to phase-adjust a board (reference) clock signal. In a step 420, the reference clock signal is passed through a PLL that includes a digital feedback delay line having a plurality of taps. In a step 430, one of the plurality of taps is activated to insert a corresponding delay into the PLL and thereby advance the reference clock signal a desired amount. Next, in a step 440, the phase-adjusted reference clock signal is employed to drive a latch or any other circuitry local to a module in a synchronous sequential logic circuit. The method 400 then ends in a step 450.

Although the present invention has been described in detail, those skilled in the art should understand that they can make various changes, substitutions and alterations herein without departing from the spirit and scope of the invention in its broadest form.

What is claimed is:

1. A phase-locked loop (PLL), comprising:
   a digital feedback delay line having a plurality of taps cascaded from an input to an output with each of said taps having a fixed delay; and
   tap selection logic, coupled to said digital feedback delay line, for decoding a single signal to activate a first one of said plurality of taps to couple an input signal of said digital feedback delay line to said first one and to activate each subsequent one of said plurality of taps to select an output of a preceding tap, thereby inserting a corresponding delay into said PLL including fixed delays associated with said first one and said each subsequent one of said plurality of taps.

2. The PLL as recited in claim 1 wherein each of said taps comprises a multiplexer.

3. The PLL as recited in claim 2 wherein said multiplexer is 2:1 input multiplexer.

4. The PLL as recited in claim 1 wherein said digital feedback delay line has at least four of said taps.

5. The PLL as recited in claim 4 wherein said digital feedback delay line has 32 of said taps.

6. The PLL as recited in claim 1 wherein said first one and said each subsequent one of said plurality of taps is activated by a separate selection bit.

7. The PLL as recited in claim 1 wherein said tap selection logic comprises a register.

8. A method of programmably adjusting a phase of a reference clock signal, comprising:
   passing said reference clock signal through a phase-locked loop (PLL) that includes a digital feedback delay line having a plurality of taps cascaded from an input to an output with each of said taps having a fixed delay; and
   decoding a single signal to activate a first one of said plurality of taps to couple an input signal of said digital feedback delay line to said first one and to activate each subsequent one of said plurality of taps to select an output of a preceding tap to insert a corresponding delay into said PLL, including fixed delays associated with said first one and said each subsequent one of said plurality of taps.

9. The method as recited in claim 8 wherein each of said taps comprises a multiplexer.

10. The method as recited in claim 9 wherein said multiplexer is a 2:1 input multiplexer.

11. The method as recited in claim 8 wherein said digital feedback delay line has at least four of said taps.

12. The method as recited in claim 11 wherein said digital feedback delay line has 32 of said taps.

13. The method as recited in claim 8 wherein said first one and said each subsequent one of said plurality of taps is activated by a separate selection bit.

14. A synchronous sequential logic circuit, comprising:
   a system clock that produces a reference clock signal;
   a plurality of interconnected modules that operate synchronously to communicate data therebetween, each of said plurality of interconnected modules containing a phase-locked loop (PLL) that receives said reference clock signal and includes:

a digital feedback delay line having a plurality of taps cascaded from an input to an output with each of said taps having a fixed delay, and tap selection logic, coupled to said digital feedback delay line, for decoding a single signal to activate a first one of said plurality of taps to couple an input signal of said digital feedback delay line to said first and to activate each subsequent one of said plurality of taps to select an output of a preceding tap thereby inserting corresponding delay into said PLL, including fixed delays associated with said first one and said each subsequent one of said plurality of taps.

15. The circuit as recited in claim 14 wherein each of said taps comprises a multiplexer.

16. The circuit as recited in claim 15 wherein said multiplexer is a 2:1 input multiplexer.

17. The circuit as recited in claim 14 wherein said digital feedback delay line has at least four of said taps.

18. The circuit as recited in claim 17 wherein said digital feedback delay line has 32 of said taps.

19. The circuit as recited in claim 14 wherein said tap selection logic comprises a register.

20. The circuit as recited in claim 19 wherein said tap selection logic includes a decoder that receives said single signal from said register and decodes said single signal to a selection bit for each of said first one and said each subsequent one of said plurality of taps.

* * * * *